US006960932B2

(12) United States Patent
Ko

(10) Patent No.: US 6,960,932 B2
(45) Date of Patent: Nov. 1, 2005

(54) APPARATUS AND METHOD TO CORRECT A REFERENCE VOLTAGE

(75) Inventor: Wan-seok Ko, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 10/690,502

(22) Filed: Oct. 23, 2003

(65) Prior Publication Data

US 2004/0108870 A1 Jun. 10, 2004

(30) Foreign Application Priority Data

Nov. 6, 2002 (KR) ................................ 10-2002-0068486

(51) Int. Cl.[7] ............................................ H03K 19/003
(52) U.S. Cl. ........................... 326/33; 326/30; 327/538
(58) Field of Search ...................... 326/30–34; 327/538, 327/540

(56) References Cited

U.S. PATENT DOCUMENTS 5,132,555 A * 7/1992 Takahashi ................... 326/102
5,568,064 A * 10/1996 Beers et al. .................. 326/31
5,966,086 A 10/1999 Kubo et al. ................. 341/155
6,876,248 B2 * 4/2005 Nguyen et al. ............. 327/538

FOREIGN PATENT DOCUMENTS

| | | |
|---|---|---|
| JP | 2000-207381 | 7/2000 |
| JP | 2001-109530 | 4/2001 |
| KR | 1998-048996 | 9/1998 |
| KR | 1998-060859 | 10/1998 |
| KR | 1998-079463 | 11/1998 |
| KR | 2000-0003572 | 1/2000 |
| KR | 2000-0015310 | 3/2000 |

* cited by examiner

*Primary Examiner*—James H. Cho
(74) *Attorney, Agent, or Firm*—Staas & Halsey LLP

(57) ABSTRACT

An apparatus and method thereof to correct a reference voltage, Vref, include a first digital device and a second digital device to input/output digital data via a bus, an adjustable resistor providing a main supply voltage VDD, a fixed resistor, wherein the adjustable resistor and the fixed resistor generate a Vref correction by dividing the main supply voltage VDD. A Vref setup selecting part of the apparatus and method selects the Vref correction and a Vref controller changes a resistance value of the adjustable resistor according to a selection of the Vref correction through the Vref setup selecting part, determines an optimum resistance value of the adjustable resistor, and outputs an optimum Vref correction.

16 Claims, 3 Drawing Sheets

APPARATUS AND METHOD TO CORRECT A REFERENCE VOLTAGE

CROSS-REFERENCE TO RELATED APPLICATIONS

This application claims the benefit of Korean Application No. 2002-68486, filed Nov. 6, 2002, in the Korean Intellectual Property Office, the disclosure of which is incorporated herein by reference.

BACKGROUND OF THE INVENTION

1. Field of the Invention

The present invention relates to an apparatus and a method to correct a reference voltage, more especially to an apparatus and a method to correct a reference voltage to enable the reference voltage of electric devices to be corrected using software.

2. Description of the Related Art

Each of electric devices included in a digital system exchange data via a bus. The data exchanged via the bus has a digital form represented as an electrical 1 (high) or 0 (low). The electric devices recognize the data by recognizing a combination of 0 and 1 in transferred digital signals.

Accordingly, the electric devices have a reference voltage (Vref) to discriminate whether a received signal is 0 or 1. That is, if a voltage of the received signal is higher than the Vref, then the electric devices recognize the received signal as 1, or else if the voltage for the received signal is lower than the Vref, then the electrical devices recognize the received signal as 0.

FIG. 3 is a schematic view illustrating a circuit of a conventional device supplying the reference voltage Vref. Specifically FIG. 3 illustrates the circuit to supply the reference voltage Vref to two electric devices exchanging the digital data via the bus connected between each other.

As shown in FIG. 3, digital devices A and B 101 and 103 are provided to input/output the digital data between each other via a bus 105. The digital data is in a form of a signal electrically discriminated as 1 or 0, and, thus, the digital device A 101 and B 103 receive the Vref in order to discriminate the received signal.

The Vref is generally laid out so as to be output from a node between two resistors R1 120 and R2 106 connected in series to a VDD line, which is a main supply voltage of digital devices. The R1 120 and the R2 106 are fixed resistors and, thus, once laid out, it is impossible to adjust a resistance of the resistors R1 120 and R2 106.

Recently, as an operating speed of the electric devices is gradually increasing, noise in the digital data signal frequently occurs. Accordingly, accuracy of the Vref has been emphasized for accurate recognition of the digital data signal.

Also, in a case of transforming characteristics of the digital data signal with respect to (electromagnetic interference) EMI and, thus, tuning data transfer efficiency, the Vref is also to be adjusted according to the transformed data signal. In a case of adjusting the Vref, a user cannot manually connect resistors having different resistance values to a circuit in order to find appropriate new resistors R1 and R2 corresponding to an intended Vref, and if the user finds the appropriate new resistors R1 and R2, then the user has to change the old R1 and R2 to the new ones having an appropriate resistance value manually.

SUMMARY OF THE INVENTION

In accordance with an aspect of the present invention, there is provided an apparatus for reference voltage correction and a method therefor to enable a reference voltage of electric devices to be corrected using software.

Additional aspects and/or advantages of the invention will be set forth in part in the description which follows and, in part, will be obvious from the description, or may be learned by practice of the invention.

The foregoing and/or other aspects of the present invention are achieved by providing an apparatus for correcting a reference voltage (Vref) of a digital device to input/output digital data, including a Vref setup selecting part selecting a correction of the Vref; a Vref adjusting circuit adjusting the Vref of the digital device; and a Vref control storing part storing a Vref control program to change a setup of the Vref adjusting circuit to vary the Vref output from the Vref adjusting circuit to be varied, detecting a transmission state of the digital data of the digital device, determining an optimum setup of the Vref adjusting circuit to allow error bits of the digital data to be minimized, and setting up the Vref adjusting circuit according to selection of the Vref correction through the Vref setup selecting part.

According to an aspect of the present invention, the Vref control program includes a BIOS program.

According to an aspect of the present invention, the Vref adjusting circuit includes an adjustable resistor, and a fixed resistor to generate the Vref correction by dividing a main supply voltage of the digital device, wherein the Vref control program changes a resistance value of the adjustable resistor according to the selection of the Vref correction through the Vref setup selecting part, detects the transmission state of the digital data of the digital devices, determines an optimum resistance value of the adjustable resistor to allow the error bits of the digital data to be minimized, and sets up the resistance value of the adjustable resistor as the optimum resistance value.

According to an aspect of the present invention, the apparatus for correcting the reference voltage further includes a Vref optimum setup storing part to store data of optimum setup condition of the Vref adjusting circuit.

The foregoing and/or other aspects of the present invention are also achieved by providing a method to correct a reference voltage, Vref, of digital device having a Vref adjusting circuit to adjust the Vref, including selecting a reference voltage correction; changing a setup of the Vref adjusting circuit to vary the Vref; detecting a transmission state of digital data output from the digital device, according to the changed setup of the Vref adjusting circuit; determining an optimum setup of the Vref adjusting circuit to allow error bits of the digital data to be minimized; and setting up the Vref adjusting circuit according to the optimum setup.

According to an aspect of the present invention, there is provided a method to correct a reference voltage, Vref, between first and second digital devices using fixed and variable resistors, including: selecting a Vref correction via a BIOS setup menu; adjusting a resistance value of the adjustable resistor; loading a digital signal corresponding to a change of the resistance value of the adjustable resistor through a bus; confirming a state that the digital signal is transmitted; calculating an optimum resistance value of the adjustable resistor where a Vref correction is output to minimize error bits of the transferred digital signal; setting up the resistance value of the adjustable resistor as a calculated optimum resistance value; and storing the optimum resistance value.

According to an aspect of the present invention, there is provided an apparatus to correct a reference voltage, Vref, including: a first digital device and a second digital device inputting/outputting digital data via a bus; an adjustable resistor providing a main supply voltage VDD; a fixed resistor, wherein the adjustable resistor and the fixed resistor generate a Vref correction by dividing the main supply voltage VDD; a Vref setup selecting part selecting the Vref correction; and a Vref controller changing a resistance value of the adjustable resistor according to a selection of the Vref correction through the Vref setup selecting part, determining an optimum resistance value of the adjustable resistor, and outputting an optimum Vref correction.

According to an aspect of the present invention, there is provided a method to correct a reference voltage, Vref, between first and second digital devices, including: selecting a Vref correction via a BIOS setup menu; adjusting a resistance value; loading a digital signal corresponding to a change of the resistance value through a bus; confirming a state that the digital signal is transmitted; calculating an optimum resistance value where a Vref correction is output to minimize error bits of the transferred digital signal; setting up the resistance value as a calculated optimum resistance value; and storing the optimum resistance value.

BRIEF DESCRIPTION OF THE DRAWINGS

These and/or other aspects and advantages of the present invention will become apparent and more readily appreciated from the following description of the embodiments, taken in conjunction with the accompany drawings of which.

DETAILED DESCRIPTION OF THE PREFERRED EMBODIMENT

Figure 1:
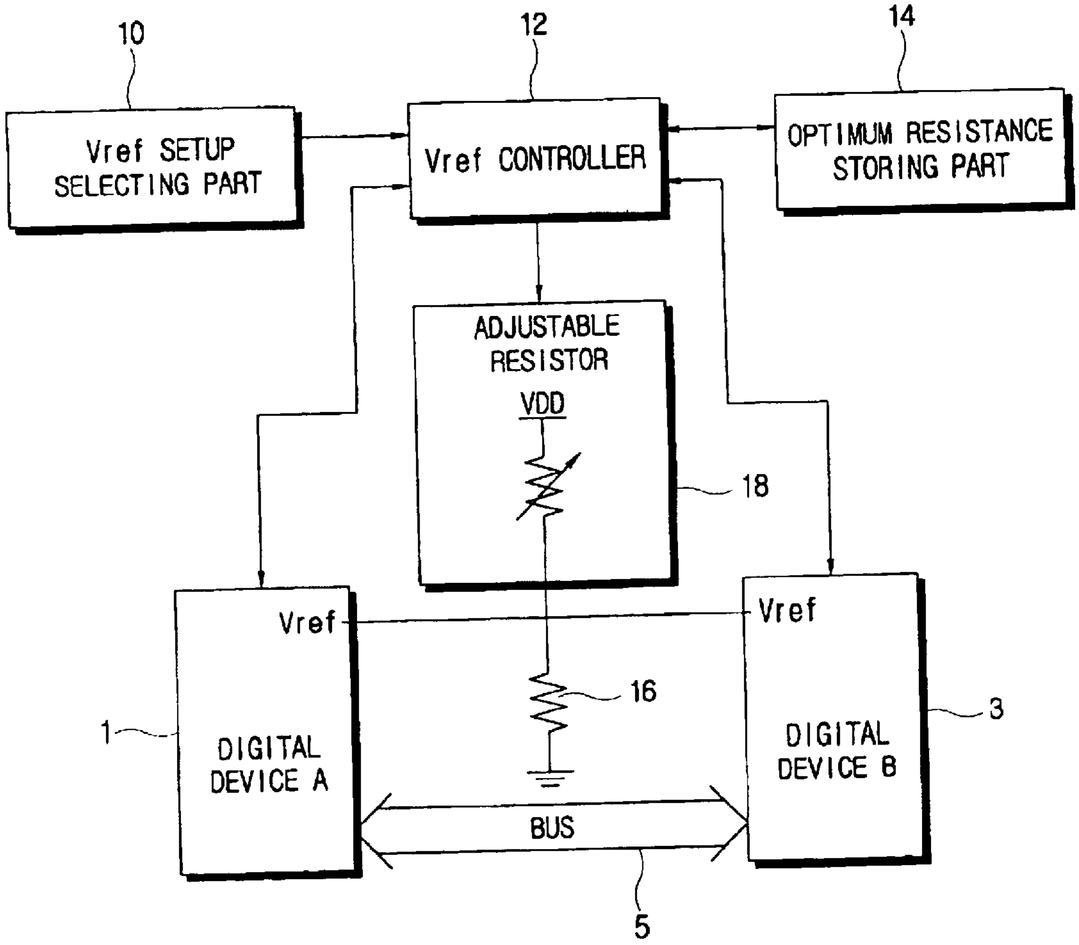
FIG. 1 is a block diagram illustrating a control system of an apparatus to correct a reference voltage, according to an aspect of the present invention.

Reference will now be made in detail to the aspects of the present invention, examples of which are illustrated in the accompanying drawings, wherein like reference numerals refer to like elements throughout. The aspects are described below in order to explain the present invention by referring to the figures.

FIG. 1 is a block diagram illustrating a control system of an apparatus to correct a reference voltage, according to an aspect of the present invention. As shown in FIG. 1, the apparatus for reference voltage correction includes a digital device A1 and a digital device B3 to input/output digital data via a bus 5, an adjustable resistor 18 and a fixed resistor 16 to generate a Vref (reference voltage) correction by dividing a main supply voltage VDD of the digital device A1 and B3, a Vref setup selecting part 10 to select the Vref correction, and a Vref controller 12 to change a resistance value of the adjustable resistor 18 according to a selection of the Vref correction through the Vref setup selecting part 10, thereby determining an optimum resistance value of the adjustable resistor 18 and outputting an optimum Vref. The Vref controller 12 allows setting up the adjustable resistor 18 so as to have the optimum resistance value. The apparatus also includes an optimum resistance storing part 14 to store the optimum resistance value.

The Vref setup selecting part 10 is provided for a user's selection of the Vref correction. Digital devices including the Vref correction may be of various types, such as a CPU, a memory, etc. Thus, the Vref setup selecting part 10 of a user interface adapted for one of the digital devices to be optimized, may be provided in a form of a BIOS menu.

The Vref controller 12 changes a resistance value of the adjustable resistor 18 by several mΩ, according to the selection of the Vref correction, and analyzes signals input into the digital device A1 and the digital device B3 by transmitting through the bus 5 a digital signal corresponding to the change of the resistance value of the adjustable resistor 18. The Vref controller 12 confirms a transmission state of the digital signal according to the change of the resistance value of the adjustable resistor 18 and, thus, confirms if error bits occur in the received signal. The Vref controller 12 calculates the optimum resistance value where the occurrence of the error bits is notably low and sets up the resistance value of the adjustable resistor 18 as the calculated optimum resistance value.

Furthermore, the Vref controller 12 stores the optimum resistance storing part 14 with the calculated optimum resistance value and sets up the resistance value of the adjustable resistor 18 as the optimum resistance value. Thus, until the optimum resistance value is set up again, the resistance value of the adjustable resistor 18 is set up as the calculated optimum resistance value, so that an optimum Vref can be provided.

The Vref controller 12 is implemented by software, such as a BIOS to perform the control process described above. Accordingly, the Vref setup selecting part 10 to select an optimum voltage setup of the digital devices A1 and B3 may be a BIOS setup menu provided by the BIOS.

Figure 2:
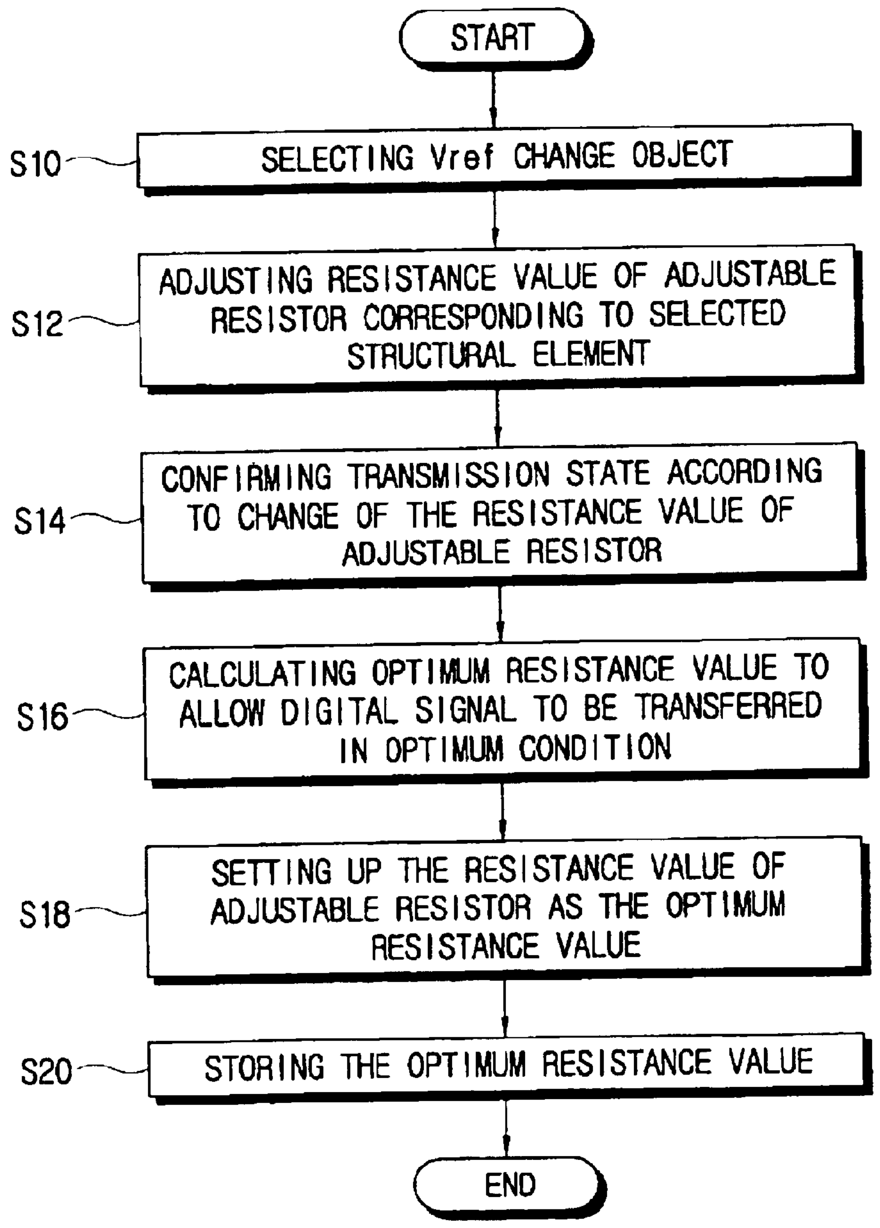
FIG. 2 is a flow chart illustrating a method to correct the reference voltage, according to an aspect of the present invention.
Figure 3:
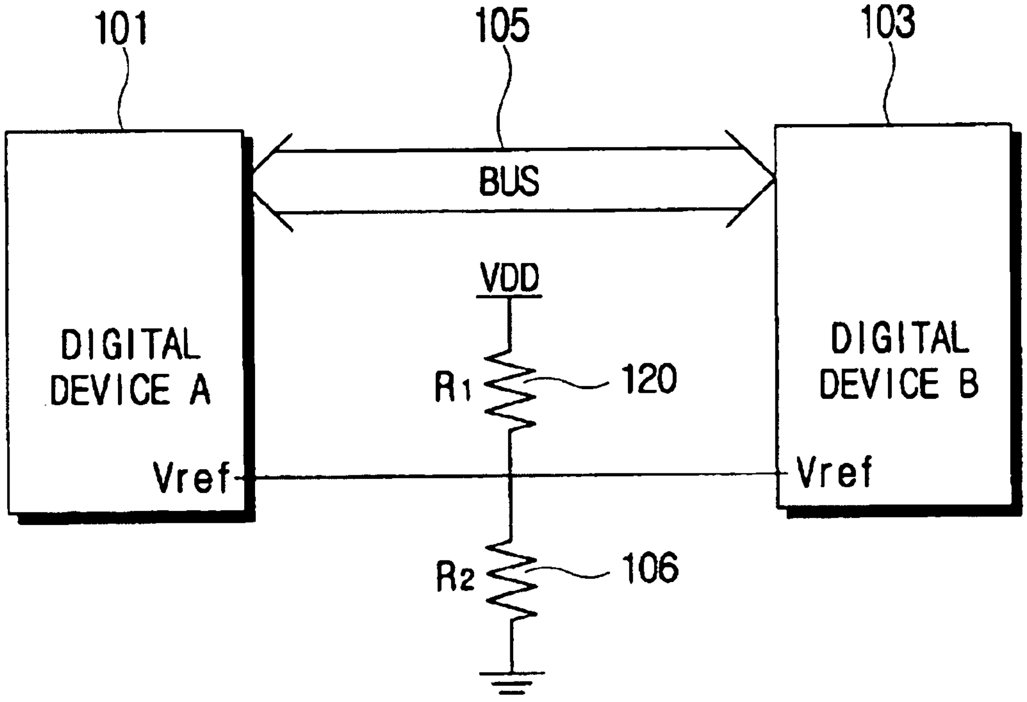
FIG. 3 (PRIOR ART)
FIG. 3 is a schematic view illustrating a circuit of a conventional device to supply the reference voltage.

As shown in FIG. 2, a Vref correction process for the apparatus using the reference voltage correction previously described is illustrated. Hereinafter, for illustrative purposes, it is assumed that the Vref controller 12 of the apparatus for the reference voltage correction is implemented using the BIOS software.

At operation S10, if the user selects a Vref correction via the BIOS setup menu, the Vref controller 12, or the BIOS adjusts the resistance value of the adjustable resistor 18. The Vref controller 12 transmits [loads a] the digital signal corresponding to the change of the resistance value of the adjustable resistor 18 through the bus 5, and, thus, at operation S14, confirms a state that the digital signal is transmitted. At operation S16, the Vref controller 12 calculates the optimum resistance value of the adjustable resistor 18 where the Vref correction is output to minimize the error bits of the transferred digital signal. At operation S18, the Vref controller 12 sets up the resistance value of the adjustable resistor 18 as the calculated optimum resistance value, and, at operation S20, stores the optimum resistance value. Accordingly, the digital device A1 and B3 can receive the optimum Vref. Further in a case that adjustment of the Vref is needed in the future, the Vref can be easily adjusted by repeating the above process.

In the meanwhile, in accordance with an aspect of the present invention, the resistance of the adjustable resistor is adjusted and set up, but according to an aspect of the present invention, the setup of the Vref adjusting circuit through which the optimum Vref is obtained may be maintained and updated by using software. Thus, an aspect of the present invention may be adapted to various kinds of circuits to adjust the Vref with the adjustable resistor.

With the above description, according to the present invention, when digital signals are transferred to a digital device, a Vref adjusting circuit determines, maintains, and updates an optimum Vref where error bits of the digital signals are minimized, to thereby enable the Vref to be corrected easily in an optimum condition.

As described above, according to the present invention, there is provided an apparatus and a method for correcting a reference voltage to enable the reference voltage to be corrected using software.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An apparatus to correct a reference voltage (Vref) of a digital device to input/output digital data, comprising:

a Vref setup selecting part selecting a correction of the Vref;

a Vref adjusting circuit adjusting the Vref of the digital device; and a Vref control storing part storing a Vref control program to change setup of the Vref adjusting circuit to vary the Vref output from the Vref adjusting circuit to be varied, detecting a transmission state of the digital data of the digital device, determining an optimum setup of the Vref adjusting circuit to allow error bits of the digital data to be minimized, and setting up the Vref adjusting circuit according to selection of the Vref correction through the Vref setup selecting part.

2. The apparatus for correcting the reference voltage according to claim 1, wherein the Vref control program comprises a BIOS program.

3. The apparatus to correct the reference voltage according to claim 1, wherein the Vref adjusting circuit comprises:

an adjustable resistor, and a fixed resistor to generate the Vref correction by dividing a main supply voltage of the digital device, wherein the Vref control program changes a resistance value of the adjustable resistor according to the selection of the Vref correction through the Vref setup selecting part, detects the transmission state of the digital data of the digital devices, determines an optimum resistance value of the adjustable resistor to allow the error bits of the digital data to be minimized, and sets up the resistance value of the adjustable resistor as the optimum resistance value.

4. The apparatus for correcting the reference voltage according to claim 2, wherein the Vref adjusting circuit comprises:

an adjustable resistor, and a fixed resistor to generate the Vref correction by dividing a main supply voltage of the digital device, wherein the Vref control program changes a resistance value of the adjustable resistor according to the selection of the Vref correction through the Vref setup selecting part, detects the transmission state of the digital data of the digital devices, determines an optimum resistance value of the adjustable resistor to allow the error bits of the digital data to be minimized, and sets up the resistance value of the adjustable resistor as the optimum resistance value.

5. The apparatus for correcting the reference voltage according to claim 1, further comprising:

a Vref optimum setup storing part to store data of optimum setup condition of the Vref adjusting circuit.

6. An apparatus to correct a reference voltage, Vref, comprising:

a first digital device and a second digital device inputting/outputting digital data via a bus;

an adjustable resistor providing a main supply voltage VDD;

a fixed resistor, wherein the adjustable resistor and the fixed resistor generate a Vref correction by dividing the main supply voltage VDD;

a Vref setup selecting part selecting the Vref correction; and a Vref controller changing a resistance value of the adjustable resistor according to a selection of the Vref correction through the Vref setup selecting part, determining an optimum resistance value of the adjustable resistor, and outputting an optimum Vref correction.

7. The apparatus to correct the reference voltage according to claim 6, wherein the Vref controller analyzes signals input/output between the first and second digital devices by transmitting through the bus a digital signal corresponding to the change of the resistance value of the adjustable resistor.

8. The apparatus to correct the reference voltage according to claim 7, wherein the Vref controller confirms a transmission state of the digital signal according to the change of the resistance value of the adjustable resistor and confirms if error bits occur in the digital signal.

9. The apparatus to correct the reference voltage according to claim 6, wherein the Vref controller calculates the optimum resistance value where the occurrence of the error bits is low and sets up the resistance value of the adjustable resistor as the calculated optimum resistance value.

10. The apparatus to correct the reference voltage according to claim 6, further comprising:

an optimum resistance storing part storing the optimum resistance value.

11. The apparatus to correct the reference voltage according to claim 6, wherein the Vref controller comprises a BIOS program.

12. A method to correct a reference voltage, Vref, of digital device having a Vref adjusting circuit to adjust the Vref, comprising:

selecting a reference voltage correction;

changing a setup of the Vref adjusting circuit to vary the Vref;

detecting a transmission state of digital data output from the digital device, according to the changed setup of the Vref adjusting circuit;

determining an optimum setup of the Vref adjusting circuit to allow error bits of the digital data to be minimized; and setting up the Vref adjusting circuit according to the optimum setup.

13. A method to correct a reference voltage, Vref, between first and second digital devices, comprising:

selecting a Vref correction via a BIOS setup menu;

adjusting a resistance value;

loading a digital signal corresponding to a change of the resistance value through a bus;

confirming a state that the digital signal is transmitted;

calculating an optimum resistance value where a Vref correction is output to minimize error bits of the transferred digital signal;

setting up the resistance value as a calculated optimum resistance value; and storing the optimum resistance value.

14. The method to correct the reference voltage according to claim 13, further comprising:

analyzing signals input/output between the first and second digital devices by transmitting through the bus the digital signal corresponding to the change of the resistance value.

15. The method to correct the reference voltage according to claim 13, wherein the confirmation of the state of transmission of the digital signal according to the change of the resistance value.

16. The method to correct the reference voltage according to claim 15, further comprising:

confirming whether error bits occur in the digital signal;

calculating the optimum resistance value where the occurrence of the error bits is low; and setting up the resistance value as the calculated optimum resistance value.

* * * * *